(12) United States Patent
Timmermans et al.

(10) Patent No.: US 7,510,299 B2
(45) Date of Patent: *Mar. 31, 2009

(54) LED LIGHTING DEVICE FOR REPLACING FLUORESCENT TUBES

(75) Inventors: Jos Timmermans, Ortonville, MI (US); Jean C. Raymond, Nominique (CA); John Ivey, Farmington Hills, MI (US)

(73) Assignee: Altair Engineering, Inc., Troy, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/925,037

(22) Filed: Oct. 26, 2007

(65) Prior Publication Data

US 2008/0062680 A1    Mar. 13, 2008

Related U.S. Application Data

(63) Continuation of application No. 11/085,744, filed on Mar. 21, 2005, which is a continuation of application No. 09/782,375, filed on Feb. 12, 2001, now Pat. No. 7,049,761.

(60) Provisional application No. 60/181,744, filed on Feb. 11, 2000.

(51) Int. Cl.
*F21S 4/00* (2006.01)
*H01R 33/08* (2006.01)

(52) U.S. Cl. ............... 362/225; 362/221; 362/249; 362/659

(58) Field of Classification Search ............... 362/221, 362/225, 659, 249, 800; 315/200 R, 291, 315/246

See application file for complete search history.

(56) References Cited

U.S. PATENT DOCUMENTS

| | | | | |
|---|---|---|---|---|
| 3,612,855 A | * | 10/1971 | Juhnke | 362/235 |
| 4,211,955 A | * | 7/1980 | Ray | 315/53 |
| 4,581,687 A | * | 4/1986 | Nakanishi | 362/653 |
| 4,748,545 A | * | 5/1988 | Schmitt | 362/219 |
| 4,943,900 A | * | 7/1990 | Gartner | 362/227 |
| 5,027,037 A | * | 6/1991 | Wei | 315/200 A |
| 5,036,248 A | * | 7/1991 | McEwan et al. | 313/500 |
| 5,103,382 A | * | 4/1992 | Kondo et al. | 362/503 |
| 5,321,593 A | * | 6/1994 | Moates | 362/251 |
| 5,388,357 A | | 2/1995 | Malita | |
| 5,463,280 A | * | 10/1995 | Johnson | 315/187 |
| 5,575,459 A | * | 11/1996 | Anderson | 362/240 |
| 5,607,227 A | | 3/1997 | Yasumoto et al. | |
| 5,655,830 A | * | 8/1997 | Ruskouski | 362/240 |

(Continued)

OTHER PUBLICATIONS

Web page at http://trucklite.com/leds 14.html printed on Jan. 13, 2000.

(Continued)

*Primary Examiner*—Ismael Negron
(74) *Attorney, Agent, or Firm*—Young Basile

(57) ABSTRACT

A light tube for replacing fluorescent tubes including a bulb portion and a pair of end caps disposed at opposite ends of the bulb portion, and configured for illumination by a power supply circuit. A plurality of light emitting diodes are disposed inside the bulb portion and in electrical communication with a pair of end caps for illuminating in response to electrical current to be received from the power supply circuit.

6 Claims, 10 Drawing Sheets

U.S. PATENT DOCUMENTS

| | | | |
|---|---|---|---|
| 5,688,042 A | 11/1997 | Madadi et al. | |
| 5,697,695 A | 12/1997 | Lin et al. | |
| 5,726,535 A | 3/1998 | Yan | |
| 5,813,751 A | 9/1998 | Shaffer | |
| 5,890,794 A | 4/1999 | Abtahi et al. | |
| 5,924,784 A | 7/1999 | Chliwnyj et al. | |
| 5,949,347 A | 9/1999 | Wu | |
| 5,998,928 A * | 12/1999 | Hipp | 315/77 |
| 6,072,280 A | 6/2000 | Allen | |
| 6,149,283 A * | 11/2000 | Conway et al. | 362/236 |
| 6,158,882 A | 12/2000 | Bischoff, Jr. | |
| 6,305,109 B1 | 10/2001 | Lee | |
| 6,325,651 B1 | 12/2001 | Nishihara et al. | |
| 6,371,637 B1 | 4/2002 | Atchinson et al. | |
| 6,577,072 B2 | 6/2003 | Saito et al. | |
| 6,582,103 B1 | 6/2003 | Popovich et al. | |
| 6,609,804 B2 * | 8/2003 | Nolan et al. | 362/20 |
| 6,853,151 B2 * | 2/2005 | Leong et al. | 315/185 R |
| 6,857,924 B2 * | 2/2005 | Fu et al. | 445/24 |
| 6,997,576 B1 * | 2/2006 | Lodhie et al. | 362/240 |
| 7,049,761 B2 * | 5/2006 | Timmermans et al. | 315/246 |
| 7,249,865 B2 * | 7/2007 | Robertson | 362/228 |
| 2003/0102810 A1 * | 6/2003 | Cross et al. | 315/74 |
| 2004/0012959 A1 * | 1/2004 | Robertson et al. | 362/247 |
| 2006/0126325 A1 * | 6/2006 | Lefebvre et al. | 362/217 |

OTHER PUBLICATIONS

Web page at http://trucklite.com/leds 2html printed on Jan. 13, 2000.
Web page at http://trucklite.com/leds 4.html printed on Jan. 13, 2000.
Web page at http://www/telecite.com/en/products/options en.htm printed on Jan. 13, 2000.
Web page at http://www/dialight.com/trans.htm printed on Jan. 13, 2000.
Web page at http://www/ledlights.com/replac.htm printed on Jan. 13, 2000.
LEDtronics, apparently 1996 Catalog, apparently cover page and p. 10.
Office Action dated May 15, 2008 in U.S. Appl. No. 11/007,417.
*Altair Engineering, Inc.* v. *Leddynamics, Inc.*, Case No. 07-CV-13150 (E.D. Mich., Aug. 12, 2008) (J. Steeh) ("Order Resolving Claim Construction Dispute" for U.S. Pat. No. 7,049,761).

* cited by examiner

LED LIGHTING DEVICE FOR REPLACING FLUORESCENT TUBES

CROSS-REFERENCE TO RELATED APPLICATIONS

This application is a continuation of U.S. patent application Ser. No. 11/085,744, filed Mar. 21, 2005, which is a continuation of U.S. patent application Ser. No. 09/782,375, filed Feb. 12, 2001, now U.S. Pat. No. 7,049,761, issued May 23, 2006, which claims the benefit of U.S. Provisional Application No. 60/181,744 filed Feb. 11, 2000.

FIELD OF THE INVENTION

The present invention relates to a light tube illuminated by LEDs (light emitting diodes) which are packaged inside the light tube and powered by a power supply circuit.

BACKGROUND OF THE INVENTION

Conventional fluorescent lighting systems include fluorescent light tubes and ballasts. Such lighting systems are used in a variety of locations, such as buildings and transit buses, for a variety of lighting purposes, such as area lighting or backlighting. Although conventional fluorescent lighting systems have some advantages over known lighting options, such as incandescent lighting systems, conventional fluorescent light tubes and ballasts have several shortcomings. Conventional fluorescent light tubes have a short life expectancy, are prone to fail when subjected to excessive vibration, consume high amounts of power, require a high operating voltage, and include several electrical connections which reduce reliability. Conventional ballasts are highly prone to fail when subjected to excessive vibration.

Accordingly, there is a desire to provide a light tube and power supply circuit which overcome the shortcomings of conventional fluorescent lighting systems. That is, there is a desire to provide a light tube and power supply circuit which have a long life expectancy, are resistant to vibration failure, consume low amounts of power, operate on a low voltage, and are highly reliable. It would also be desirable for such a light tube to mount within a conventional fluorescent light tube socket.

SUMMARY OF THE INVENTION

A light tube for illumination by a power supply circuit including a bulb portion and a pair of end caps disposed at opposite ends of the bulb portion. A plurality of light emitting diodes are disposed inside the bulb portion and in electrical communication with the pair of end caps for illuminating in response to electrical current to be received from the power supply circuit.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
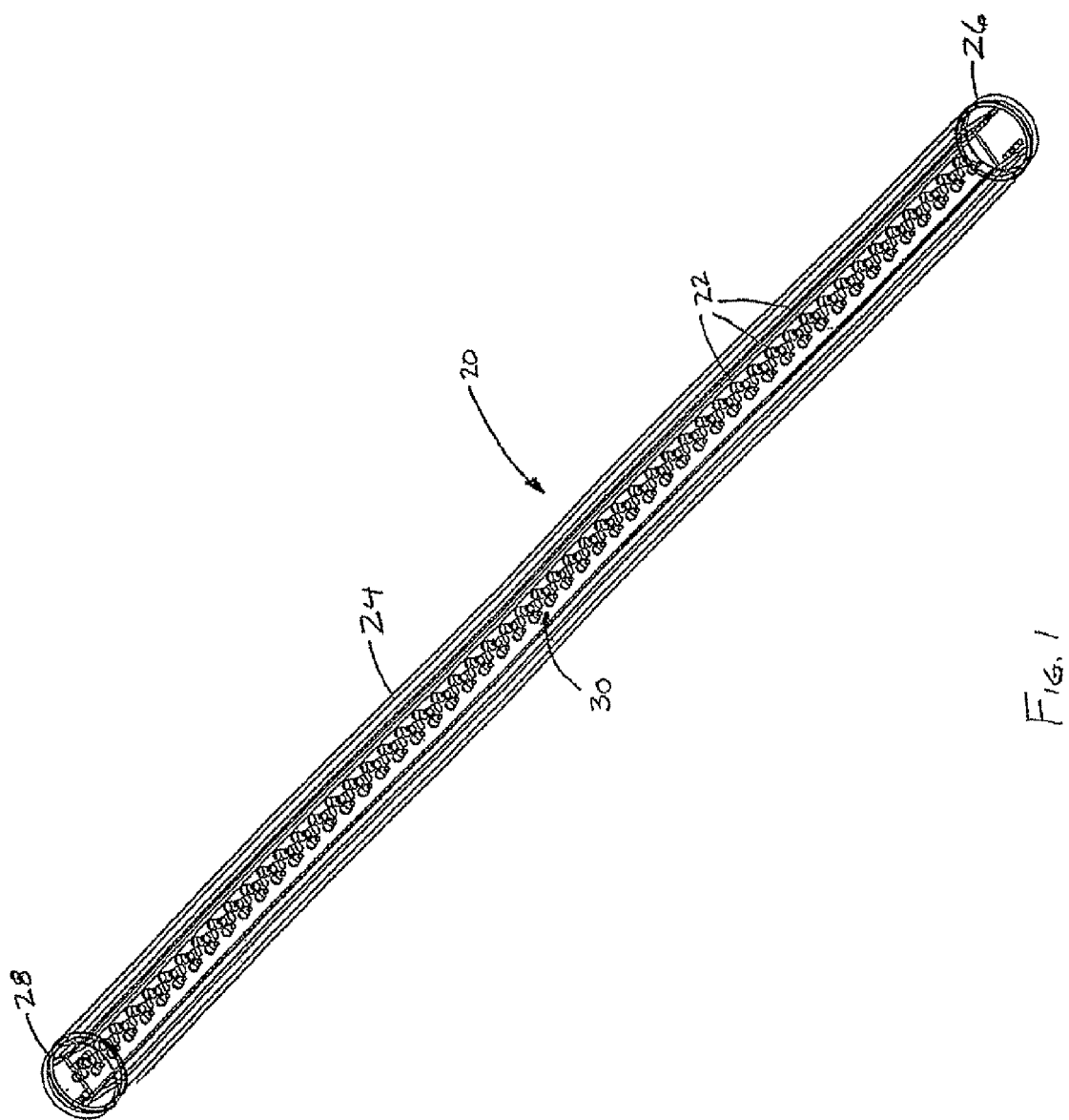
FIG. 1 is a line drawing showing a light tube, in perspective view, which in accordance with the present invention is illuminated by LEDs packaged inside the light tube.

FIG. 1 is a line drawing showing a light tube 20 in perspective view. In accordance with the present invention, the light tube 20 is illuminated by LEDs 22 packaged inside the light tube 20. The light tube 20 includes a cylindrically shaped bulb portion 24 having a pair of end caps 26 and 28 disposed at opposite ends of the bulb portion. Preferably, the bulb portion 24 is made from a transparent or translucent material such as glass, plastic, or the like. As such, the bulb material may be either clear or frosted.

In a preferred embodiment of the present invention, the light tube 20 has the same dimensions and end caps 26 and 28 (e.g. electrical male bi-pin connectors, type G13) as a conventional fluorescent light tube. As such, the present invention can be mounted in a conventional fluorescent light tube socket (not shown).

The line drawing of FIG. 1 also reveals the internal components of the light tube 20. The light tube 20 further includes a circuit board 30 with the LEDs 22 mounted thereon. The circuit board 30 and LEDs 22 are enclosed inside the bulb portion 24 and the end caps 26 and 28.

Figure 2:
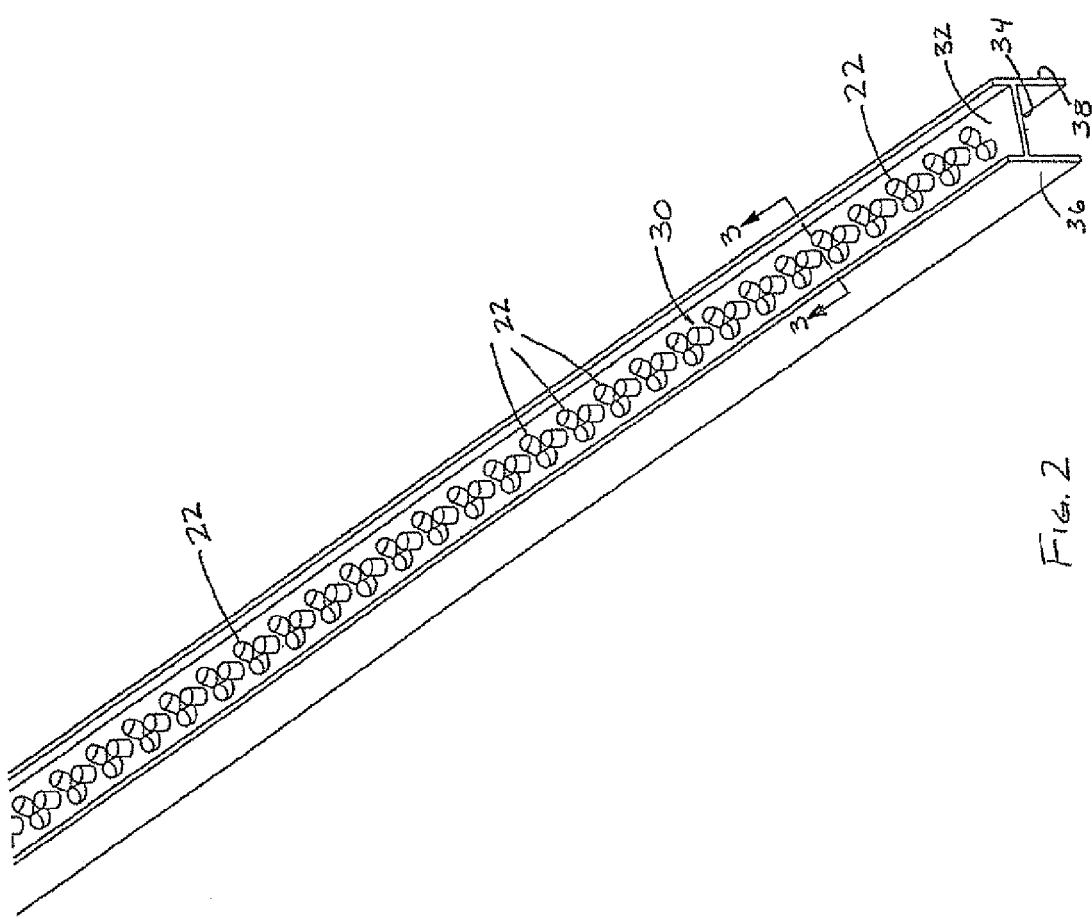
FIG. 2 is a perspective view of the LEDs mounted on a circuit board.

FIG. 2 is a perspective view of the LEDs 22 mounted on the circuit board 30. A group of LEDs 22, as shown in FIG. 2, is commonly referred to as a bank or array of LEDs. Within the scope of the present invention, the light tube 20 may include one or more banks or arrays of LEDs 22 mounted on one or more circuit boards 30. In a preferred embodiment of the present invention, the LEDs 22 emit white light and, thus, are commonly referred to in the art as white LEDs. In FIGS. 1 and 2, the LEDs 22 are mounted to one surface 32 of the circuit board 30. In a preferred embodiment of the present invention, the LEDs 22 are arranged to emit or shine white light through only one side of the bulb portion 24, thus directing the white light to a predetermined point of use. This arrangement reduces light losses due to imperfect reflection in a convention lighting fixture. In alternative embodiments of the present invention, LEDs 22 may also be mounted, in any combination, to the other surfaces 34, 36, and/or 38 of the circuit board 30.

Figure 3:
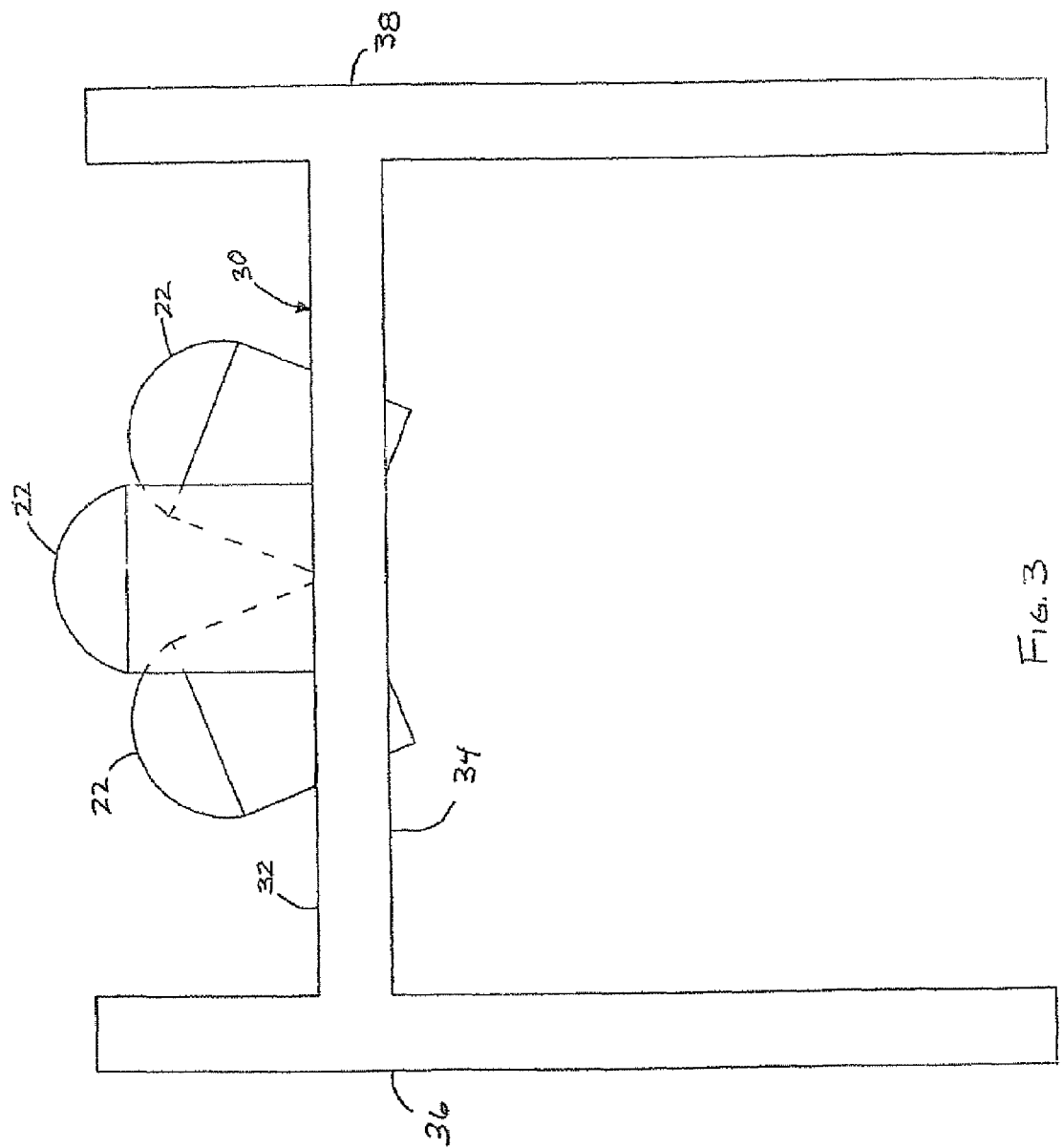
FIG. 3 is a cross-sectional view of FIG. 2 taken along lines 3-3.

FIG. 3 is a cross-sectional view of FIG. 2 taken along lines 3-3. To provide structural strength along the length of the light tube 20, the circuit board 30 is designed with a H-shaped cross-section. To produce a predetermined radiation pattern or dispersion of light from the light tube 20, each LED 22 is mounted at an angle relative to adjacent LEDs and/or the mounting surface 32. The total radiation pattern of light from the light tube 20 is effected by (1) the mounting angle of the LEDs 22 and (2) the radiation pattern of light from each LED.

Currently, white LEDs having a viewing range between 6° and 45° are commercially available.

Figure 4:
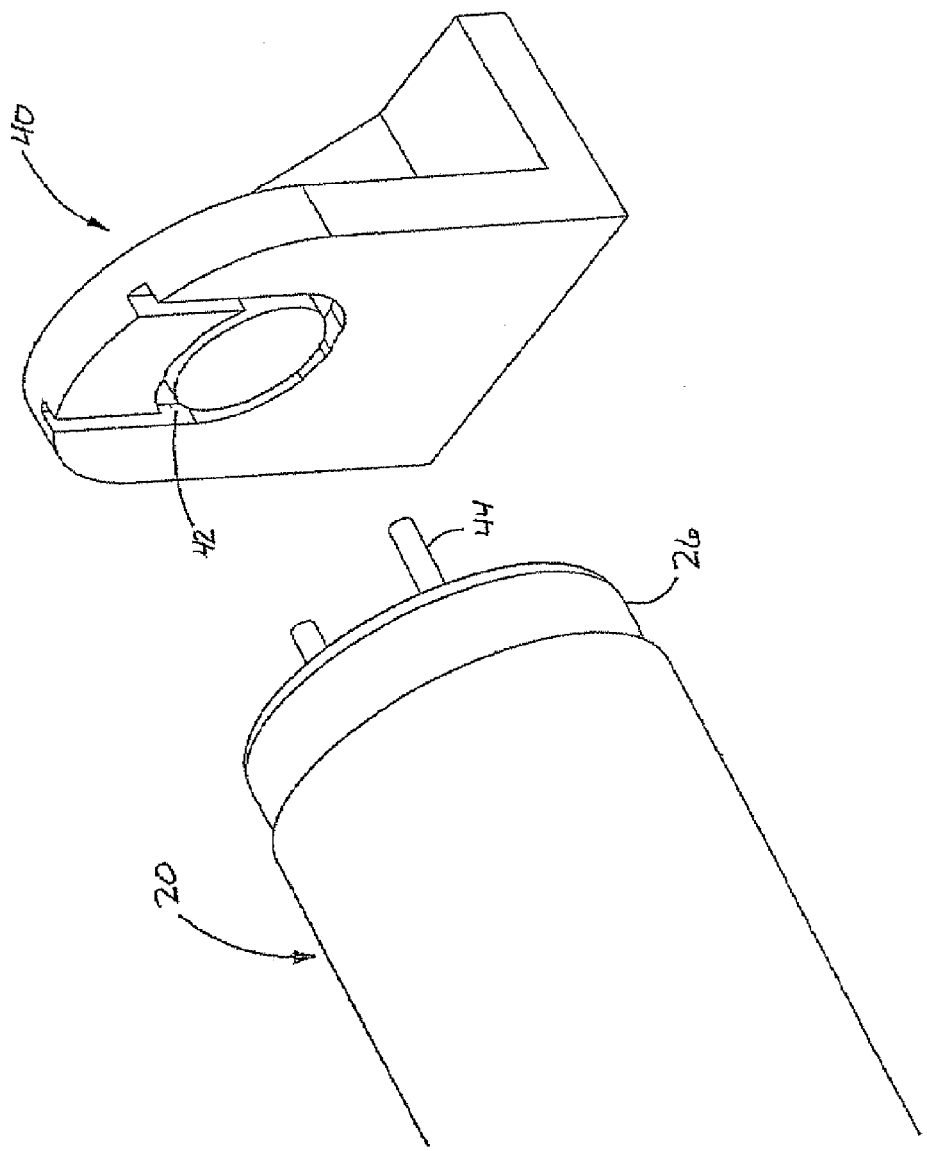
FIG. 4 is a fragmentary, perspective view of one embodiment of the present invention showing one end of the light tube disconnected from one end of a light tube socket.

FIG. 4 is a fragmentary, perspective view of one embodiment of the present invention showing one end of the light tube 20 disconnected from one end of a light tube socket 40. Similar to conventional fluorescent lighting systems and in this embodiment of the present invention, the light tube socket 40 includes a pair of electrical female connectors 42 and the light tube 20 includes a pair of mating electrical male connectors 44.

Within the scope of the present invention, the light tube 20 may be powered by one of four power supply circuits 100, 200, 300, and 400. A first power supply circuit includes a power source and a conventional fluorescent ballast. A second power supply circuit includes a power source and a rectifier/filter circuit. A third power supply circuit includes a DC power source and a PWM (Pulse Width Modulation) circuit. A fourth power supply circuit powers the light tube 20 inductively.

Figure 5:
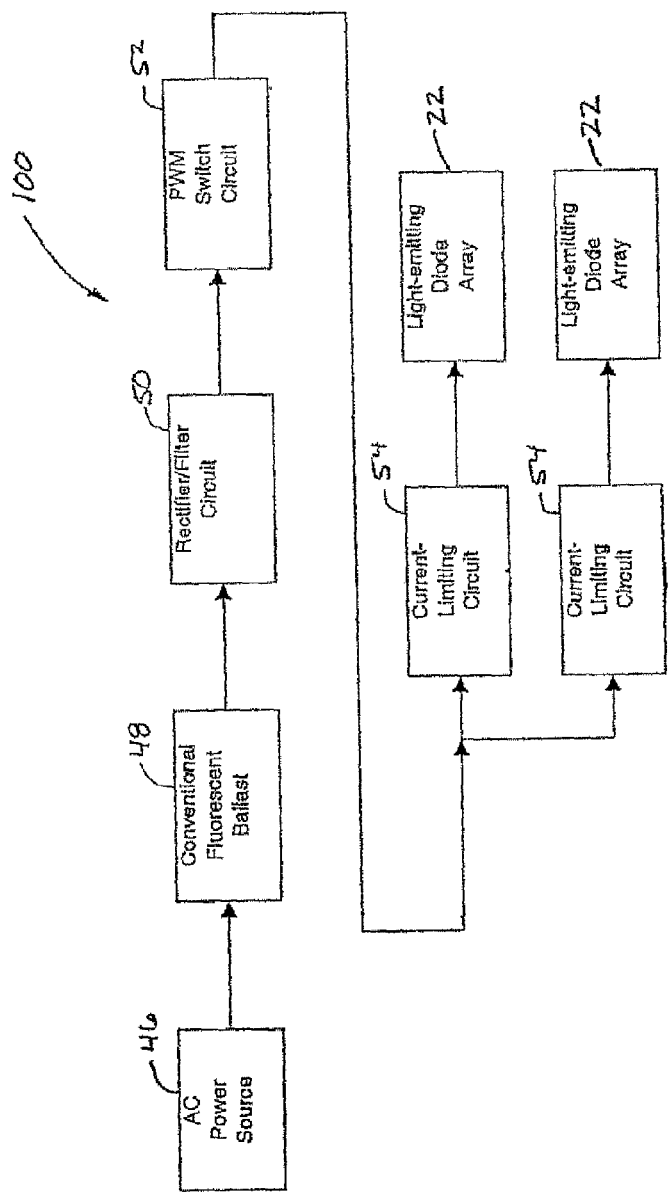
FIG. 5 is an electrical block diagram of a first power supply circuit for supplying power to the light tube.

FIG. 5 is an electrical block diagram of a first power supply circuit 100 for supplying power to the light tube 20. The first power supply circuit 100 is particularly adapted to operate within an existing, conventional fluorescent lighting system. As such, the first power supply circuit 100 includes a conventional fluorescent light tube socket 40 having two electrical female connectors 42 disposed at opposite ends of the socket. Accordingly, a light tube 20 particularly adapted for use with the first power supply circuit 100 includes two end caps 26 and 28, each end cap having the form of an electrical male connector 44 which mates with a corresponding electrical female connector 42 in the socket 40.

The first power supply circuit 100 also includes a power source 46 and a conventional magnetic or electronic fluorescent ballast 48. The power source 46 supplies power to the conventional fluorescent ballast 48.

The first power supply circuit 100 further includes a rectifier/filter circuit 50, a PWM circuit 52, and one or more current-limiting circuits 54. The rectifier/filter circuit 50, the PWM circuit 52, and the one or more current-limiting circuits 54 of the first power supply circuit 100 are packaged inside one of the two end caps 26 or 28 of the light tube 20.

The rectifier/filter circuit 50 receives AC power from the ballast 48 and converts the AC power to DC power. The PWM circuit 52 receives the DC power from the rectifier/filter circuit 50 and pulse-width modulates the DC power to the one or more current-limiting circuits 54. In a preferred embodiment of the present invention, the PWM circuit 52 receives the DC power from the rectifier/filter circuit 50 and cyclically switches the DC power on and off to the one or more current-limiting circuits 54. The DC power is switched on and off by the PWM circuit 52 at a frequency which causes the white light emitted from the LEDs 22 to appear, when viewed with a "naked" human eye, to shine continuously. The PWM duty cycle can be adjusted or varied by control circuitry (not shown) to maintain the power consumption of the LEDs 22 at safe levels.

The DC power is modulated for several reasons. First, the DC power is modulated to adjust the brightness or intensity of the white light emitted from the LEDs 22 and, in turn, adjust the brightness or intensity of the white light emitted from the light tube 20. Optionally, the brightness or intensity of the white light emitted from the light tube 20 may be adjusted by a user. Second, the DC power is modulated to improve the illumination efficiency of the light tube 20 by capitalizing upon a phenomenon in which short pulses of light at high brightness or intensity to appear brighter than a continuous, lower brightness or intensity of light having the same average power. Third, the DC power is modulated to regulate the intensity of light emitted from the light tube 20 to compensate for supply voltage fluctuations, ambient temperature changes, and other such factors which effect the intensity of white light emitted by the LEDs 22. Fourth, the DC power is modulated to raise the variations of the frequency of light above the nominal variation of 120 to 100 Hz thereby reducing illumination artifacts caused by low frequency light variations, including interactions with video screens. Fifth, the DC power may optionally be modulated to provide an alarm function wherein light from the light tube 20 cyclically flashes on and off.

The one or more current-limiting circuits 54 receive the pulse-width modulated or switched DC power from the PWM circuit 52 and transmit a regulated amount of power to one or more arrays of LEDs 22. Each current-limiting circuit 54 powers a bank of one or more white LEDs 22. If a bank of LEDs 22 consists of more than one LED, the LEDs are electrically connected in series in an anode to cathode arrangement. If brightness or intensity variation between the LEDs 22 can be tolerated, the LEDs can be electrically connected in parallel.

The one or more current-limiting circuits 54 may include (1) a resistor, (2) a current-limiting semiconductor circuit, or (3) a switching power supply type current limiter.

Figure 6:
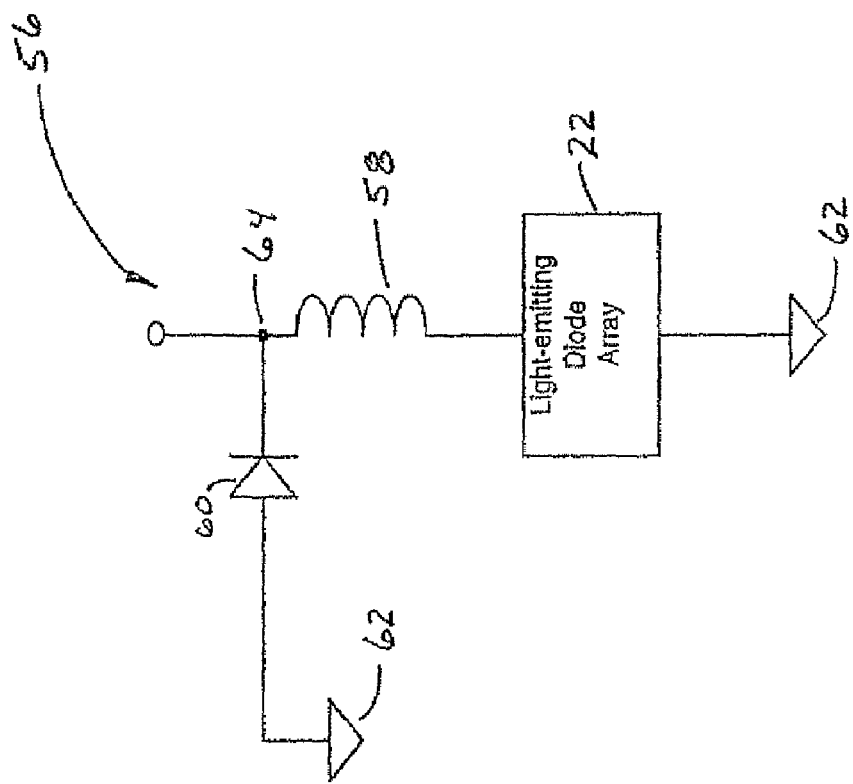
FIG. 6 is an electrical schematic of a switching power supply type current limiter.

FIG. 6 is an electrical schematic of a switching power supply type current limiter 56. The limiter 56 includes an inductor 58, electrically connected in series between the PWM circuit 52 and the array of LEDs 22, and a power diode 60, electrically connected between ground 62 and a PWM circuit/inductor node 64. The diode 60 is designed to begin conduction after the PWM circuit 52 is switched off. In this case, the value of the inductor 58 is adjusted in conjunction with the PWM duty cycle to provide the benefits described above. The switching power supply type current limiter 56 provides higher power efficiency than the other types of current-limiting circuits listed above.

Figure 7:
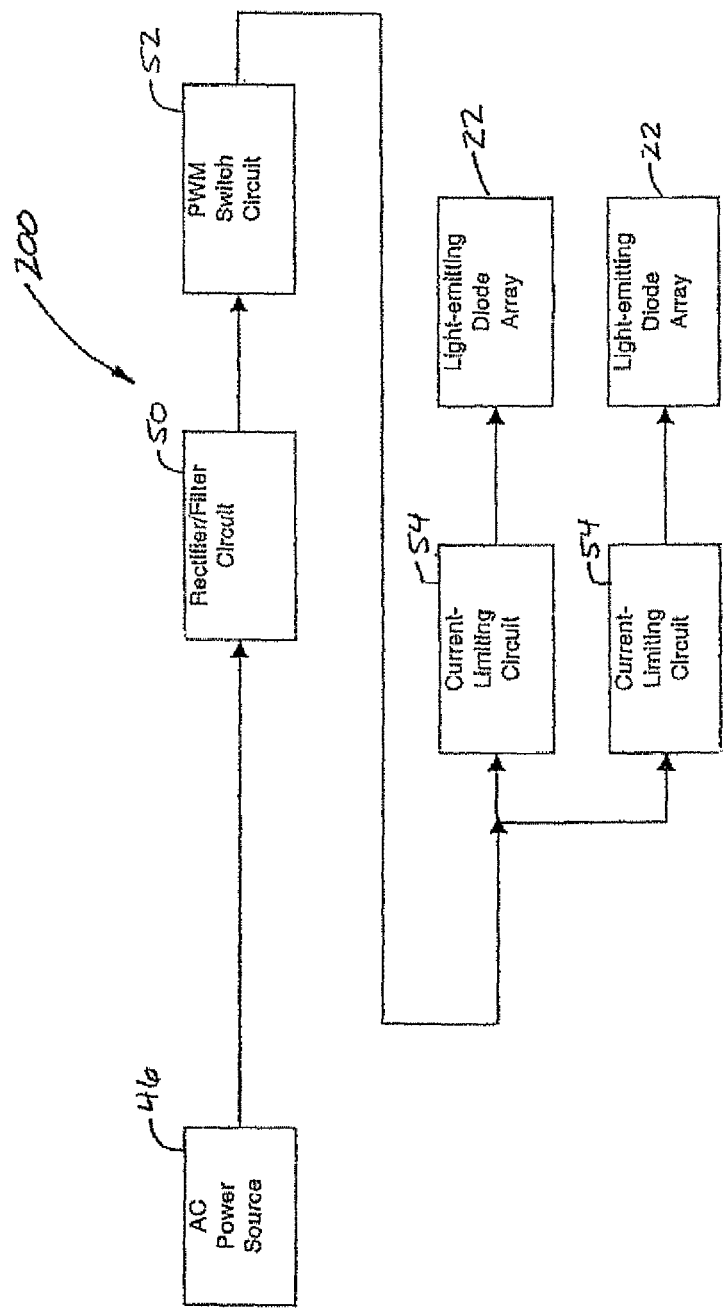
FIG. 7 is an electrical block diagram of a second power supply circuit for supplying power to the light tube.

FIG. 7 is an electrical block diagram of a second power supply circuit 200 for supplying power to the light tube 20. Similar to the first power supply circuit 100, the second power supply circuit 200 includes a conventional fluorescent light tube socket 40 having two electrical female connectors 42 disposed at opposite ends of the socket 40. Accordingly, a light tube 20 particularly adapted for use with the second power supply circuit 200 includes two end caps 26 and 28, each end cap having the form of an electrical male connector 44 which mates with a corresponding electrical female connector 42 in the socket 40.

In the second power supply circuit 200, the power source 46 supplies power directly to the rectifier/filter circuit 50. The rectifier/filter circuit 50, the PWM circuit 52, and the one or more current-limiting circuits 54 operate as described above to power the one or more arrays of LEDs 22. The rectifier/filter circuit 50, the PWM circuit 52, and the one or more current-limiting circuits 54 of the second power supply circuit 200 are preferably packaged inside the end caps 26 and 28 or the bulb portion 24 of the light tube 20 or inside the light tube socket 40.

Figure 8:
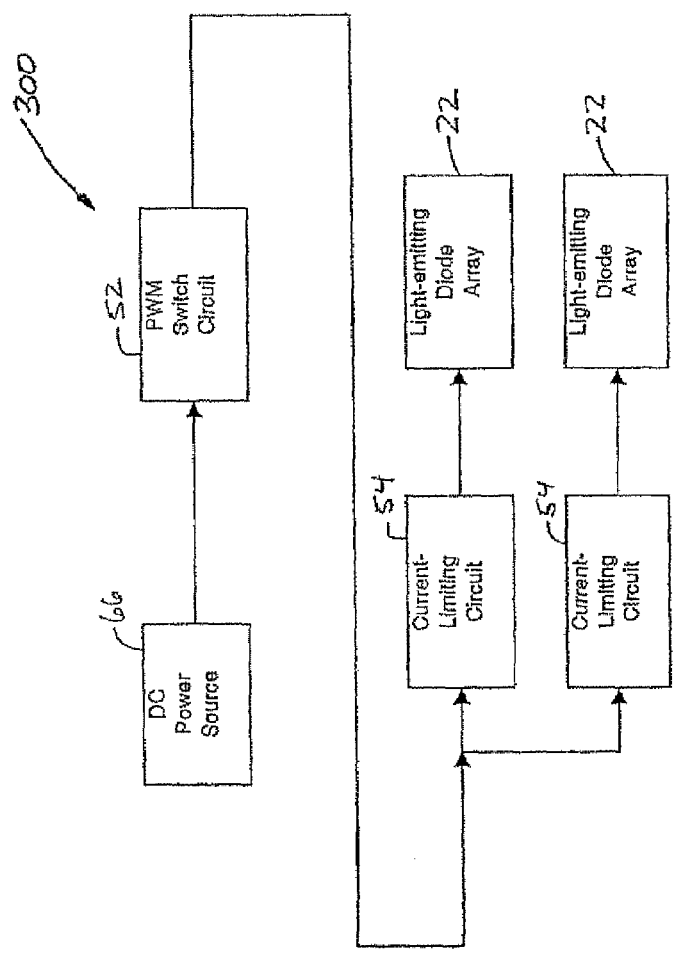
FIG. 8 is an electrical block diagram of a third power supply circuit for supplying power to the light tube.

FIG. 8 is an electrical block diagram of a third power supply circuit 300 for supplying power to the light tube 20. Similar to the first and second power supply circuits 100 and 200, the third power supply circuit 300 includes a conventional fluorescent light tube socket 40 having two electrical female connectors 42 disposed at opposite ends of the socket 40. Accordingly, a light tube 20 particularly adapted for use with the third power supply circuit 300 includes two end caps 26 and 28, each end cap having the form of an electrical male connector 44 which mates with a corresponding electrical female connector 42 in the socket 40.

The third power supply circuit 300 includes a DC power source 66, such as a vehicle battery. In the third power supply circuit 300, the DC power source 66 supplies DC power directly to the PWM circuit 52. The PWM circuit 52 and the one or more current-limiting circuits 54 operate as described above to power the one or more arrays of LEDs 22. In the third power supply circuit 300, the PWM circuit 52 is preferably packaged in physical location typically occupied by the ballast of a conventional fluorescent lighting system while the one or more current-limiting circuits 54 and LEDs 22 are preferably packaged inside the light tube 20, in either one of the two end caps 26 or 28 or the bulb portion 24.

Figure 9:
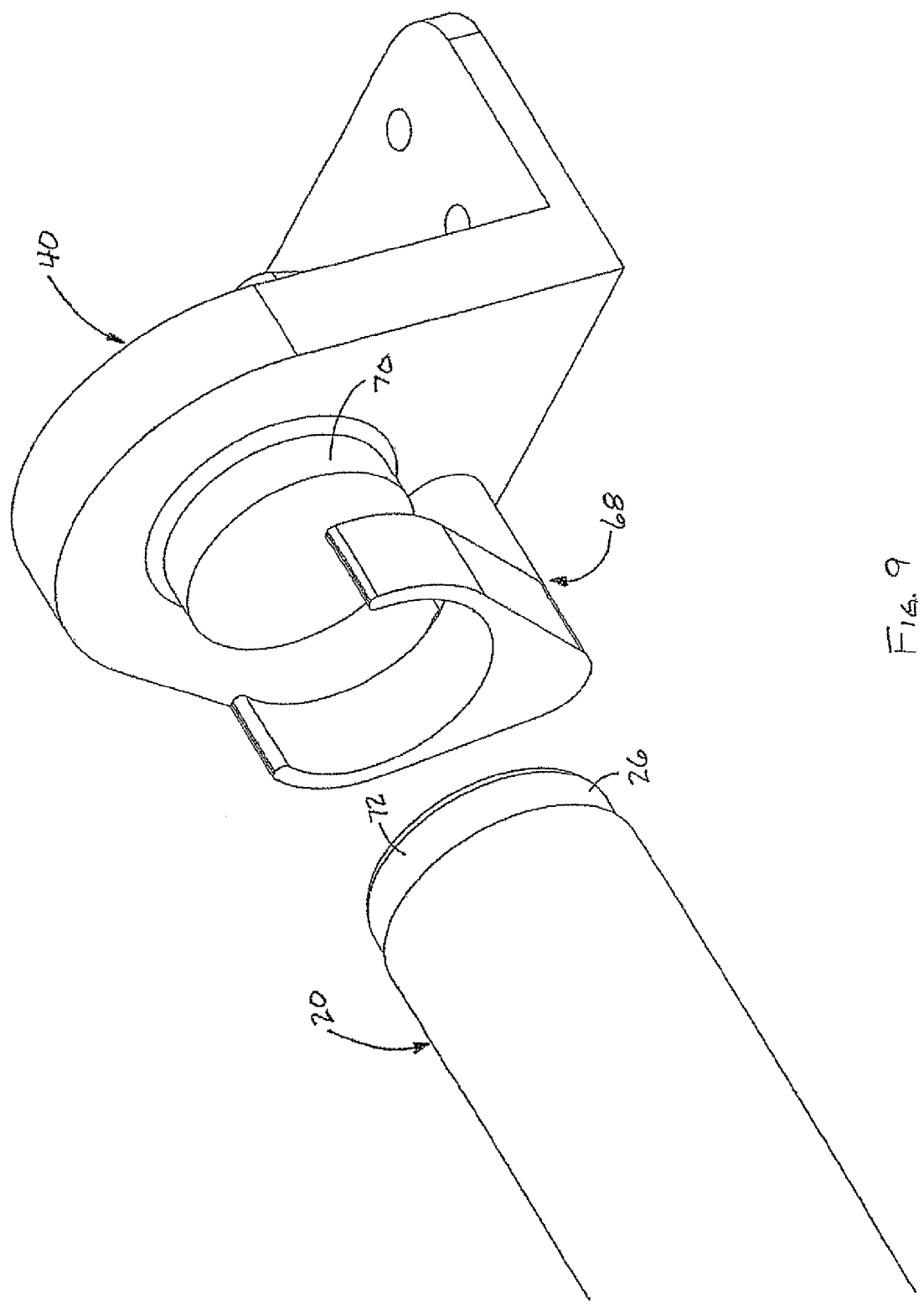
FIG. 9 is a fragmentary, perspective view of another embodiment of the present invention showing one end of the light tube disconnected from one end of the light tube socket.

FIG. 9 is a fragmentary, perspective view of another embodiment of the present invention showing one end of the light tube 20 disconnected from one end of the light tube socket 40. In this embodiment of the present invention, the light tube socket 40 includes a pair of brackets 68 and the light tube 20 includes a pair of end caps 26 and 28 which mate with the brackets 68.

Figure 10:
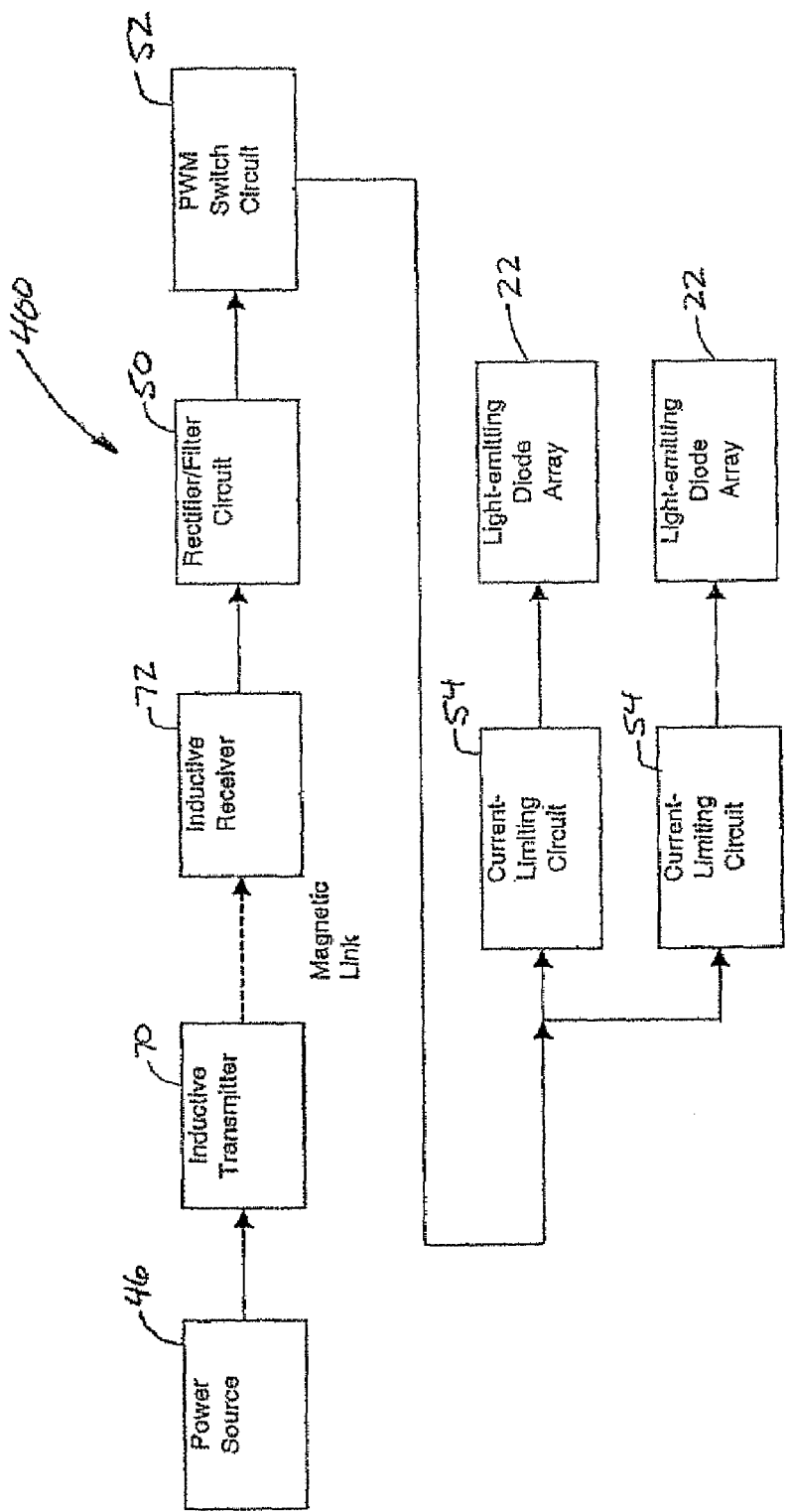
FIG. 10 is an electrical block diagram of a fourth power supply circuit for supplying power to the light tube.

FIG. 10 is an electrical block diagram of a fourth power supply circuit 400 for supplying power to the light tube 20. Unlike the first, second, and third power supply circuits 100, 200, and 300 which are powered through direct electrical male and female connectors 44 and 42, the fourth power supply circuit 400 is powered inductively. As such, the fourth power supply circuit 400 includes a light tube socket 40 having two brackets 68 disposed at opposite ends of the socket 40. At least one bracket 68 includes an inductive transmitter 70. Accordingly, a light tube 20 particularly adapted for use with the fourth power supply circuit 400 has two end caps 26 and 28 with at least one end cap including an inductive receiver or antenna 72. When the light tube 20 is mounted in the light tube socket 40, the at least one inductive receiver 72 in the light tube 20 is disposed adjacent to the at least one inductive transmitter 70 in the light tube socket 40.

The fourth power supply circuit 400 includes the power source 46 which supplies power to the at least one inductive transmitter 70 in the light tube socket 40. The at least one transmitter 70 inductively supplies power to the at least one receiver 72 in one of the end caps 26 and/or 28 of the light tube 20. The at least one inductive receiver 72 supplies power to the rectifier/filter circuit 50. The rectifier/filter circuit 50, PWM circuit 52, and the one or more current-limiting circuits 54 operate as described above to power the one or more arrays of LEDs 22. In this manner, the light tube 20 is powered without direct electrical connection.

What is claimed is:

1. An LED lighting unit for replacing a conventional fluorescent tube between the opposed electrical receptacles of a conventional fluorescent lighting fixture comprising:

a rigid, substantially cylindrical structure having a first end and a second end opposite said first end;

a first end cap disposed upon said first end of said structure and a second end cap disposed upon said second end of said structure;

a pair of parallel, fluorescent light fixture receptacle connectors extending from each said end cap and configured for installing within the opposed electrical receptacles of a lighting fixture; and a plurality of LEDs disposed along said structure in electrical contact with one another and with said pair of connectors extending from said end caps, whereby light is divergently emitted along the length of said device in an included angle of less than about 180°.

2. An elongate generally tubular lighting device for replacing a conventional fluorescent light tube comprising:

an elongate support structure providing a substantially continuous LED mounting surface extending substantially the length of said device;

a plurality of LEDs arranged along the length of said surface;

a light transmissive bulb portion overlying said surface and said LEDs to transmit light from said LEDs away from said surface;

a pair of end caps mounted to opposite ends of said device and providing male bi-pin connectors at said opposite ends for installing said device in a fluorescent light tube fixture; and said support structure providing on opposite sides of said surface opaque side Walls extending above said surface in the light emitting direction to confine the entirety of light emitted from said device to an included angle of less than about 180°.

3. An elongate tubular lighting device of given length for replacing a conventional fluorescent tube light of the type having male bi-pin connectors at each end for installation in a fixture for such lights comprising:

a support structure defining a substantially continuous, elongate LED mounting surface approximating said given length;

a plurality of LEDs arranged along the length of said surface so as to emit light from said device;

a light transmissive bulb portion overlying said surface and said LEDs to allow transmission of light from said LEDs away from Said surface; and a pair of end caps mounted to opposite ends of said device, each end cap having a set of male bi-pin connectors suitable for operative engagement with said fixture, said LEDs being electrically connected to and between said bi-pin connectors to be illuminated by power received from said fixture;

the combination of said support structure and said bulb portion being such that substantially the entire light output of said device is emitted away from said surface and confined to an included angle of less than about 180°.

4. A lighting devices defined in claim 3 wherein said bulb portion is of a structural character so as to diffuse light from said LEDs.

5. A lighting device as defined in claim 3 further including means for modulating/dimming illumination from said LEDs.

6. A lighting device as defined in claim 3 wherein the LEDs are arranged in clusters or groups of closely spaced individual light producing elements.

* * * * *

UNITED STATES PATENT AND TRADEMARK OFFICE
CERTIFICATE OF CORRECTION

PATENT NO. : 7,510,299 B2
APPLICATION NO. : 11/925037
DATED : March 31, 2009
INVENTOR(S) : Timmermans et al.

It is certified that error appears in the above-identified patent and that said Letters Patent is hereby corrected as shown below:

Column 6, Line 25 (Claim 2):   Replace "Walls" with --walls--.
Column 6, Line 40 (Claim 3):   Replace "Said" with --said--.
Column 6, Line 51 (Claim 4):   Replace "devices" with --device as--.

Signed and Sealed this

Nineteenth Day of May, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,510,299 C3  
APPLICATION NO. : 90/011762  
DATED : July 17, 2012  
INVENTOR(S) : Jos Timmermans et al.

Page 1 of 1

It is certified that error appears in the above-identified patent and that said Letters Patent is hereby corrected as shown below:

Claim 4, column 1, line 45, delete "ight" and insert -- light --

Claim 7, column 2, line 22, delete "unit" and insert -- device --

Claim 8, column 2, line 28, delete "the" after "between" and before "opposed"

Claim 8, column 2, line 31, insert -- , and including a support structure and a bulb portion --

Claim 8, column 2, line 32, insert -- cylindrical -- after "said" and before "structure"

Claim 8, column 2, line 34, insert -- cylindrical -- after "said" and before "structure"

Claim 8, column 2, line 39, insert -- a surface of -- after "disposed along" and before "said"

Claim 8, column 2, line 39, insert -- support -- after "said" and before "structure"

Signed and Sealed this  
Fifth Day of March, 2013

Teresa Stanek Rea  
*Acting Director of the United States Patent and Trademark Office*

(12) EX PARTE REEXAMINATION CERTIFICATE (7868th)
United States Patent
Timmermans et al.

(10) Number: US 7,510,299 C1
(45) Certificate Issued: Nov. 9, 2010

(54) LIGHTING DEVICE WITH LEDS

(75) Inventors: Jos Timmermans, Ortonville, MI (US);
Jean C. Raymond, Nominique (CA);
John Ivey, Farmington Hills, MI (US)

(73) Assignee: Altair Engineering, Inc., Troy, MI (US)

Reexamination Request:
No. 90/010,644, Oct. 16, 2009

Reexamination Certificate for:
Patent No.: 7,510,299
Issued: Mar. 31, 2009
Appl. No.: 11/925,037
Filed: Oct. 26, 2007

Certificate of Correction issued May 19, 2009.

Related U.S. Application Data

(63) Continuation of application No. 11/085,744, filed on Mar. 21, 2005, which is a continuation of application No. 09/782,375, filed on Feb. 12, 2001, now Pat. No. 7,049,761.
(60) Provisional application No. 60/181,744, filed on Feb. 11, 2000.

(51) Int. Cl.
*F21S 4/00* (2006.01)
*H01R 33/08* (2006.01)

(52) U.S. Cl. ............... 362/225; 362/221; 362/249.02; 362/659

(58) Field of Classification Search ................ 362/225
See application file for complete search history.

(56) References Cited

U.S. PATENT DOCUMENTS

| | | | |
|---|---|---|---|
| 4,107,581 A | 8/1978 | Abernethy | |
| 4,597,033 A | 6/1986 | Meggs et al. | |
| 4,607,317 A | 8/1986 | Lin | |
| 4,661,890 A | 4/1987 | Watanabe et al. | |
| 4,698,730 A | 10/1987 | Sakai et al. | |
| 4,941,072 A | 7/1990 | Yasumoto et al. | |
| 5,018,054 A | 5/1991 | Ohashi et al. | |
| 5,140,220 A | 8/1992 | Hasegawa | |
| 5,151,679 A | 9/1992 | Dimmick | |
| 5,303,124 A | 4/1994 | Wrobel | |
| D354,360 S | 1/1995 | Murata | |
| 5,608,290 A | 3/1997 | Hutchisson et al. | |
| 5,622,423 A | 4/1997 | Lee | |
| 5,731,759 A | 3/1998 | Finucan | |
| 5,803,579 A | 9/1998 | Turnbull et al. | |
| 5,803,580 A | 9/1998 | Tseng | |
| 5,803,729 A | 9/1998 | Tsimerman | |
| 5,810,463 A | 9/1998 | Kawahara et al. | |
| 5,813,753 A | 9/1998 | Vriens et al. | |
| 5,825,051 A | 10/1998 | Bauer et al. | |
| 5,850,126 A | 12/1998 | Kanbar | |
| 5,865,529 A | 2/1999 | Yan | |
| 5,921,660 A | 7/1999 | Yu | |
| 6,007,209 A | 12/1999 | Pelka | |
| 6,028,694 A | 2/2000 | Schmidt | |
| 6,030,099 A | 2/2000 | McDermott | |
| 6,068,383 A | 5/2000 | Robertson et al. | |
| 6,227,679 B1 | 5/2001 | Zhang et al. | |
| 6,252,350 B1 | 6/2001 | Alvarez | |
| 6,268,600 B1 | 7/2001 | Nakamura et al. | |
| 6,305,821 B1 | 10/2001 | Hsieh et al. | |
| 6,471,388 B1 | 10/2002 | Marsh | |
| 6,528,954 B1 | 3/2003 | Lys et al. | |
| 6,577,794 B1 | 6/2003 | Currie et al. | |

(Continued)

FOREIGN PATENT DOCUMENTS

| | | |
|---|---|---|
| JP | H6-54103 | 7/1994 |
| JP | H11-135274 | 5/1999 |

*Primary Examiner*—My-Trang N. Ton

(57) ABSTRACT

A light tube for replacing fluorescent tubes including a bulb portion and a pair of end caps disposed at opposite ends of the bulb portion, and configured for illumination by a power supply circuit. A plurality of light emitting diodes are disposed inside the bulb portion and in electrical communication with a pair of end caps for illuminating in response to electrical current to be received from the power suppy circuit.

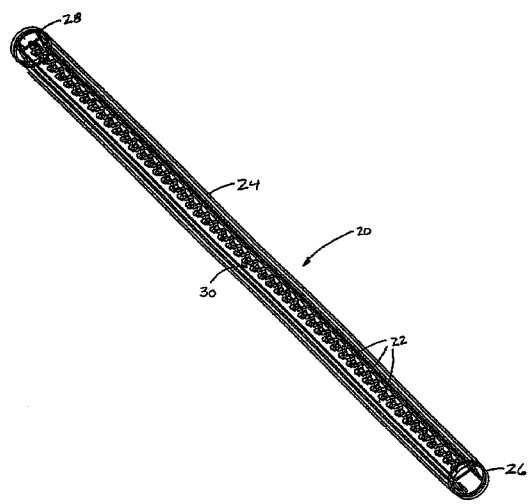

U.S. PATENT DOCUMENTS

| | | |
|---|---|---|
| 6,623,151 B2 | 9/2003 | Pederson |
| 6,712,486 B1 | 3/2004 | Popovich et al. |
| 6,995,681 B2 | 2/2006 | Pederson |
| 7,033,036 B2 | 4/2006 | Pederson |
| 7,064,674 B2 | 6/2006 | Pederson |
| 7,132,785 B2 | 11/2006 | Ducharme |
| 7,161,313 B2 | 1/2007 | Piepgras et al. |
| 7,306,353 B2 | 12/2007 | Popovich et al. |
| 7,352,339 B2 | 4/2008 | Morgan et al. |
| 7,427,840 B2 | 9/2008 | Morgan et al. |
| 2005/0184667 A1 | 8/2005 | Sturman et al. |

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-6 is confirmed.

* * * * *

(12) EX PARTE REEXAMINATION CERTIFICATE (8272nd)
United States Patent
Timmermans et al.

(10) Number: US 7,510,299 C2
(45) Certificate Issued: May 24, 2011

(54) LED LIGHTING DEVICE FOR REPLACING FLUORESCENT TUBES

(75) Inventors: Jos Timmermans, Ortonville, MI (US); Jean C. Raymond, Nominique, CA (US); John Ivey, Farmington Hills, MI (US)

(73) Assignee: Altair Engineering, Inc., Troy, MI (US)

Reexamination Request:
No. 90/011,261, Oct. 4, 2010

Reexamination Certificate for:
Patent No.: 7,510,299
Issued: Mar. 31, 2009
Appl. No.: 11/925,037
Filed: Oct. 26, 2007

Reexamination Certificate C1 7,510,299 issued Nov. 9, 2010

Certificate of Correction issued May 19, 2009.

Related U.S. Application Data

(63) Continuation of application No. 11/085,744, filed on Mar. 21, 2005, which is a continuation of application No. 09/782,375, filed on Feb. 12, 2001, now Pat. No. 7,049,761.
(60) Provisional application No. 60/181,744, filed on Feb. 11, 2000.

(51) Int. Cl.
*F21S 4/00* (2006.01)
*H01R 33/08* (2006.01)

(52) U.S. Cl. ................... 362/225; 362/221; 362/249.01; 362/659

(58) Field of Classification Search ........................ None
See application file for complete search history.

(56) References Cited

U.S. PATENT DOCUMENTS

| 4,597,033 | A | 6/1986 | Meggs et al. |
| 4,810,937 | A | 3/1989 | Havel |
| 5,463,502 | A | 10/1995 | Savage, Jr. |
| 5,943,802 | A | 8/1999 | Tijanic |
| 6,568,834 | B1 | 5/2003 | Scianna |

FOREIGN PATENT DOCUMENTS

| EP | 0632511 A2 | 1/1995 |
| WO | WO9945312 A1 | 9/1999 |
| WO | WO9957945 A1 | 9/2009 |

*Primary Examiner*—Deandra M Hughes

(57) ABSTRACT

A light tube for replacing fluorescent tubes including a bulb portion and a pair of end caps disposed at opposite ends of the bulb portion, and configured for illumination by a power supply circuit. A plurality of light emitting diodes are disposed inside the bulb portion and in electrical communication with a pair of end caps for illuminating in response to electrical current to be received from the power supply circuit.

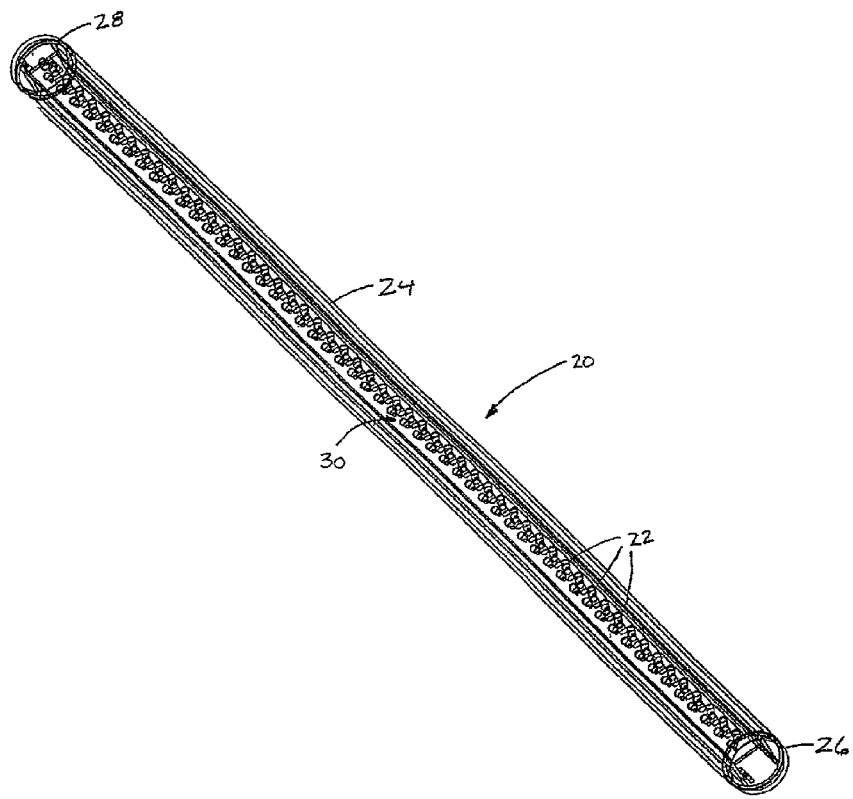

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 2-6 is confirmed.

Claim 1 is determined to be patentable as amended.

New claims 7-9 are added and determined to be patentable.

1. An LED lighting unit for replacing a conventional fluorescent tube between the opposed electrical receptacles of a conventional fluorescent lighting fixture comprising:
   a rigid, substantially cylindrical structure having a first end and a second end opposite said first end;
   a first end cap disposed upon said first end of said structure and a second end cap disposed upon said second end of said structure;
   a pair of parallel, fluorescent light fixture receptacle connectors extending from each said end cap and configured for installing within the opposed electrical receptacles of a lighting fixture; and
   a plurality of LEDs disposed along said structure in electrical contact with one another and with said pair of connectors extending from said end caps, whereby light is divergently emitted along the length of said [device] *unit* in an included angle of less than about 180°.

*7. A lighting unit as defined in claim 3 wherein sidewalls extend above a mounting surface of said plurality of LEDs on opposing sides of said plurality of LEDs such that the included angle is less than 180°.*

*8. A lighting device as defined in claim 1 wherein the combination of said support structure and said bulb portion is such that substantially the entire light output of said device is emitted away from said surface and is confined to the included angle by sidewalls extending to a height above said surface on opposing sides of said plurality of LEDs between the first end and the second end; and wherein the included angle is less than 180°.*

*9. A lighting device as defined in claim 2 wherein said opaque side walls respectively extend between said pair of end caps to confine the entirety of light emitted from said device to the included angle; and wherein the included angle is less than 180°.*

* * * * *

(12) EX PARTE REEXAMINATION CERTIFICATE (9143rd)
United States Patent
Timmermans et al.

(10) Number: US 7,510,299 C3
(45) Certificate Issued: Jul. 17, 2012

(54) LED LIGHTING DEVICE FOR REPLACING FLUORESCENT TUBES

(75) Inventors: Jos Timmermans, Ortonville, MI (US); Jean C. Raymond, Nominique, CA (US); John Ivey, Farmington Hills, MI (US)

(73) Assignee: Altair Engineering, Inc., Troy, MI (US)

Reexamination Request:
No. 90/011,762, Jun. 27, 2011

Reexamination Certificate for:
Patent No.: 7,510,299
Issued: Mar. 31, 2009
Appl. No.: 11/925,037
Filed: Oct. 26, 2007

Reexamination Certificate C1 7,510,299 issued Nov. 9, 2010

Reexamination Certificate C2 7,510,299 issued May 24, 2011

Certificate of Correction issued May 19, 2009.

Related U.S. Application Data

(63) Continuation of application No. 11/085,744, filed on Mar. 21, 2005, which is a continuation of application No. 09/782,375, filed on Feb. 12, 2001, now Pat. No. 7,049,761.
(60) Provisional application No. 60/181,744, filed on Feb. 11, 2000.

(51) Int. Cl.
*F21S 4/00* (2006.01)
*H01R 33/08* (2006.01)

(52) U.S. Cl. .................. 362/225; 362/221; 362/249.01; 362/659

(58) Field of Classification Search .................. None
See application file for complete search history.

(56) References Cited

To view the complete listing of prior art documents cited during the proceeding for Reexamination Control Number 90/011,762, please refer to the USPTO's public Patent Application Information Retrieval (PAIR) system under the Display References tab.

*Primary Examiner* — Simon Ke

(57) ABSTRACT

A light tube for replacing fluorescent tubes including a bulb portion and a pair of end caps disposed at opposite ends of the bulb portion, and configured for illumination by a power supply circuit. A plurality of light emitting diodes are disposed inside the bulb portion and in electrical communication with a pair of end caps for illuminating in response to electrical current to be received from the power supply circuit.

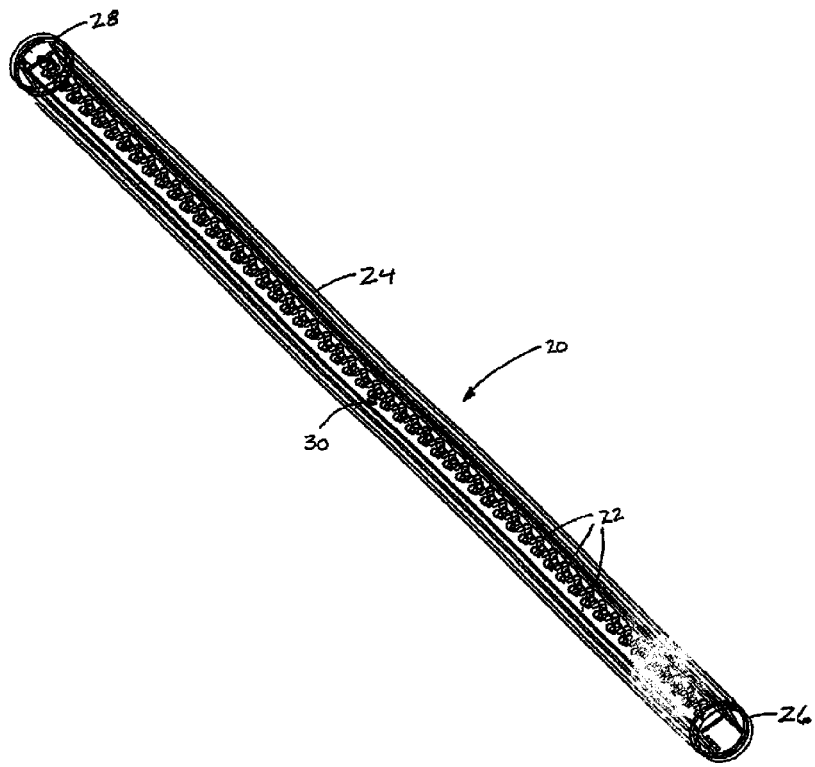

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 3 are cancelled.

Claims 2 and 4-8 are determined to be patentable as amended.

Claim 9, dependent on an amended claim, is determined to be patentable.

2. An elongate generally tubular lighting device for replacing a conventional fluorescent light tube comprising:

an elongate support structure providing a substantially continuous LED mounting surface extending substantially the length of said device;

a plurality of LEDs arranged along the length of said surface;

a light transmissive bulb portion overlying said surface and said LEDs to transmit light from said LEDs away from said surface;

a pair of end caps mounted on opposite ends of said device and providing male bi-pin connectors at said opposite ends for installing said device in a fluorescent light tube fixture; and said support structure providing on opposite sides of said surface opaque side [Walls] *walls* extending above said surface in the light emitting direction to confine the entirety of light emitted from said device said unit in an included angle of less than about 180°.

4. A lighting device as defined in claim [3] *2* wherein said bulb portion is of a structural character so as to diffuse ight from said LEDs.

5. [A lighting device as defined in claim 3] *An elongate tubular lighting device of given length for replacing a conventional fluorescent tube light of the type having male bi-pin connectors at each end for installation in a fixture for such lights comprising:*

*a support structure defining a substantially continuous, elongate LED mounting surface approximating said given length;*

*a plurality of LEDs arranged along the length of said surface so as to emit light from said device;*

*a light transmissive bulb portion overlying said surface and said LEDs to allow transmission of light from said LEDs away from said surface; and*

*a pair of end caps mounted to opposite ends of said device, each end cap having a set of male bi-pin connectors suitable for operative engagement with said fixture, said LEDs being electrically connected to and between said bi-pin connectors to be illuminated by power received from said fixture;*

*the combination of said support structure and said bulb portion being such that substantially the entire light output of said device is emitted away from said surface and confined to an included angle of less than about 180° said lighting device; and* further including:

means for modulating/dimming illumination from said LEDs.

6. A lighting device as defined in claim [3] *2* wherein the LEDs are arranged in clusters or groups of closely spaced individual light producing elements.

7. A lighting unit as defined in claim [3] *2* wherein *said opaque* sidewalls extend above a mounting surface of said plurality of LEDs on opposing sides of said plurality of LEDs such that the included angle is less than 180°.

8. [A lighting device as defined in claim 1] *An LED lighting unit for replacing a conventional fluorescent tube between the opposed electrical receptacles of a conventional fluorescent lighting fixture comprising:*

*a rigid, substantially cylindrical structure having a first end and a second end opposite said first end;*

*a first end cap disposed upon said first end of said structure and a second end cap disposed upon said second end of said structure;*

*a pair of parallel, fluorescent light fixture receptacle connectors extending from each said end cap and configured for installing within the opposed electrical receptacles of a lighting fixture; and*

*a plurality of LEDs disposed along said structure in electrical contact with one another and with said pair of connectors extending from said end caps, whereby light is divergently emitted along the length of said unit in an included angle of less than about 180°;* wherein the combination of said support structure and said bulb portion is such that substantially the entire light output of said device is emitted away from said surface and is confined to the included angle by sidewalls extending to a height above said surface on opposing sides of said plurality of LEDs between the first end and the second end; and wherein the included angle is less than 180°.

\* \* \* \* \*